(12) United States Patent  
Umeki et al.

(10) Patent No.: US 7,173,326 B2  
(45) Date of Patent: Feb. 6, 2007

(54) SEMICONDUCTOR INTEGRATED DEVICE

(75) Inventors: Nobuaki Umeki, Kyoto (JP); Hiroshi Kitani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/874,207

(22) Filed: Jun. 24, 2004

(65) Prior Publication Data

US 2004/0263145 A1 Dec. 30, 2004

(30) Foreign Application Priority Data

Jun. 24, 2003 (JP) .............................. 2003-178845

(51) Int. Cl.
*H01L 23/52* (2006.01)
(52) U.S. Cl. ...................... 257/691; 257/786; 307/443; 307/554
(58) Field of Classification Search ................ 257/664, 257/698, 691, 724, 780–786; 323/313, 265, 323/280, 907; 324/763, 765; 307/443, 451, 307/290, 554
See application file for complete search history.

(56) References Cited

U.S. PATENT DOCUMENTS 4,800,365 A * 1/1989 White et al. ................. 341/119
5,815,100 A * 9/1998 Rush et al. .................. 341/110

FOREIGN PATENT DOCUMENTS

JP 08-274261 10/1996
JP 2002-110926 4/2002

* cited by examiner

*Primary Examiner*—Rajnikant B. Patel
(74) *Attorney, Agent, or Firm*—Arent Fox PLLC.

(57) ABSTRACT

The present invention provides a semiconductor integrated device which can suppress high-frequency noise and which can thus stabilize the output voltage and power supply voltage of the reference voltage generating circuit. This semiconductor integrated device comprises a reference voltage generating circuit, a first bonding pad which is connected to the output of this reference voltage generating circuit, a lead which is connected to this first bonding pad via a first bonding wire, a second bonding pad which is connected to this lead via a second bonding wire, and a circuit which generates high-frequency noise and is connected to this second bonding pad.

4 Claims, 3 Drawing Sheets

SEMICONDUCTOR INTEGRATED DEVICE

BACKGROUND OF THE INVENTION

1. Field of the Invention

The present invention relates to a semiconductor integrated device comprising a reference voltage generating circuit and a circuit that generates high-frequency noise.

2. Description of the Related Art

There are many semiconductor integrated devices which contain a reference voltage generating circuit for the purpose of causing stable operation of the internal circuits, reducing power consumption and the like, and in which a reference voltage is supplied to the internal circuits from this reference voltage generating circuit. Furthermore, semiconductor integrated devices also exist which have external terminals that output the reference voltage of the reference voltage generating circuit to the outside. In such cases, a capacitor which has a large capacitance is connected to the external terminals in order to absorb high-frequency noise which is difficult for such a reference voltage generating circuit to absorb. Generally, in such a reference voltage generating circuit, the operational amplifier and the like, which are constituent elements of this circuit, react to low-speed signals; accordingly, low-frequency noise can be well absorbed.

The construction of the reference voltage generating circuit and surrounding parts in such a semiconductor integrated device is shown in FIG. 3. The semiconductor integrated device 101 contains a semiconductor chip 102, leads 111 and 112 whose end portions on the opposite ends from the ends facing the semiconductor chip 102 constitute external terminals, and bonding wires 121 and 122 which connect these leads 111 and 112 with the semiconductor chip 102. The semiconductor chip 102 contains a reference voltage generating circuit 141, an analog circuit 142, a digital circuit 143, and bonding pads 131 and 132. Furthermore, the reference voltage generating circuit 141 is electrically connected to analog circuit 142, digital circuit 143 and bonding pad 131, and the analog circuit 142 is electrically connected to bonding pad 132, respectively by metal wiring formed on the surface of the semiconductor chip 102. Moreover, the bonding pad 131 is electrically connected to the end portion of the lead 111 facing the semiconductor chip 102, and the bonding pad 132 is electrically connected to the end portion of the lead 112 facing the semiconductor chip 102, respectively by the bonding wires 121 and 122. An externally attached capacitor 110 which is used to absorb high-frequency noise is connected to the lead 111.

Accordingly, the output of the reference voltage generating circuit 141 is supplied to the analog circuit 142 and digital circuit 143; furthermore, this output is supplied to the lead 111 via the bonding pad 131 and bonding wire 121. Input-output of the analog circuit 142 is accomplished by means of the lead 112 via the bonding pad 132 and bonding wire 122.

As a result, in cases where high-frequency noise is generated in the digital circuit 143, it may be expected that this noise will be absorbed by the externally attached capacitor 110 via the bonding pad 131, bonding wire 121 and lead 111.

The abovementioned description also similarly holds true in cases where the digital circuit 143 is replaced by an analog circuit that is different from the analog circuit 142 and that generates high-frequency noise. Depending on the type of analog circuit used, there may be circuits in which noise (including high frequencies) is generated, and there may be cases in which such circuits are mounted on semiconductor chips along with analog circuits that are vulnerable to noise.

SUMMARY OF THE INVENTION

The impedance of a bonding wire is 10 mΩ or greater, and is ordinarily large, at approximately 100 mΩ, although this also depends on the length. Accordingly, depending on the degree of high-frequency noise, there may be cases in which such high-frequency noise is transmitted to the analog circuit 142 connected to the output of the reference voltage generating circuit 141 by the metal wiring before this high-frequency noise is absorbed, even if the above-mentioned conventional externally attached capacitor 110 that is meant to absorb high-frequency noise is used. In cases where the analog circuit 142 is vulnerable to noise, there is a danger that such noise may cause erroneous operation or a drop in precision. Moreover, there is a danger that high-frequency noise that is not absorbed may also be transmitted to the power supply of the reference voltage generating circuit 141 and affect the semiconductor chip as a whole.

Accordingly, it is an object of the present invention to provide a semiconductor integrated device in which high-frequency noise that is transmitted to the reference voltage generating circuit and analog circuits that are vulnerable to noise is suppressed, so that the output voltage and the power supply voltage of the reference voltage generating circuit are stabilized.

In order to solve the abovementioned problem, the semiconductor integrated device of the present invention comprises a reference voltage generating circuit, a first bonding pad which is connected to the output of this reference voltage generating circuit, a lead which is connected to this first bonding pad via a first bonding wire, a second bonding pad which is connected to this lead via a second bonding wire, and a circuit which generates high-frequency noise and is connected to this second bonding pad.

In this semiconductor integrated device, the high-frequency noise that is transmitted from the circuit that generates high-frequency noise via the second bonding pad and second bonding wire is absorbed by a capacitor that is externally attached to the lead before this high-frequency noise is transmitted to the reference voltage generating circuit via the first bonding wire and first bonding pad. As a result, stabilization of the power supply voltage of the reference voltage generating circuit can be achieved.

Furthermore, an analog circuit that is vulnerable to noise may be connected to the output of the reference voltage generating circuit by metal wiring, and high-frequency noise may be absorbed by an externally attached capacitor before this noise is transmitted to this circuit. As a result, erroneous operation or a drop in the precision of this analog circuit that is vulnerable to noise can be prevented.

In cases where the circuit that generates high-frequency noise in this semiconductor integrated device is a digital circuit, since digital circuits tend to generate high-frequency noise, the present invention is especially effective in stabilizing the power supply voltage of the reference voltage generating circuit and preventing erroneous operation or a drop in precision of the abovementioned analog circuit that is vulnerable to noise. Even in cases where the abovementioned circuit that generates high-frequency noise is an analog circuit, the present invention is effective in preventing the erroneous operation or drop in precision of other analog circuits due to this noise.

DESCRIPTION OF THE PREFERRED EMBODIMENTS

Figure 1:
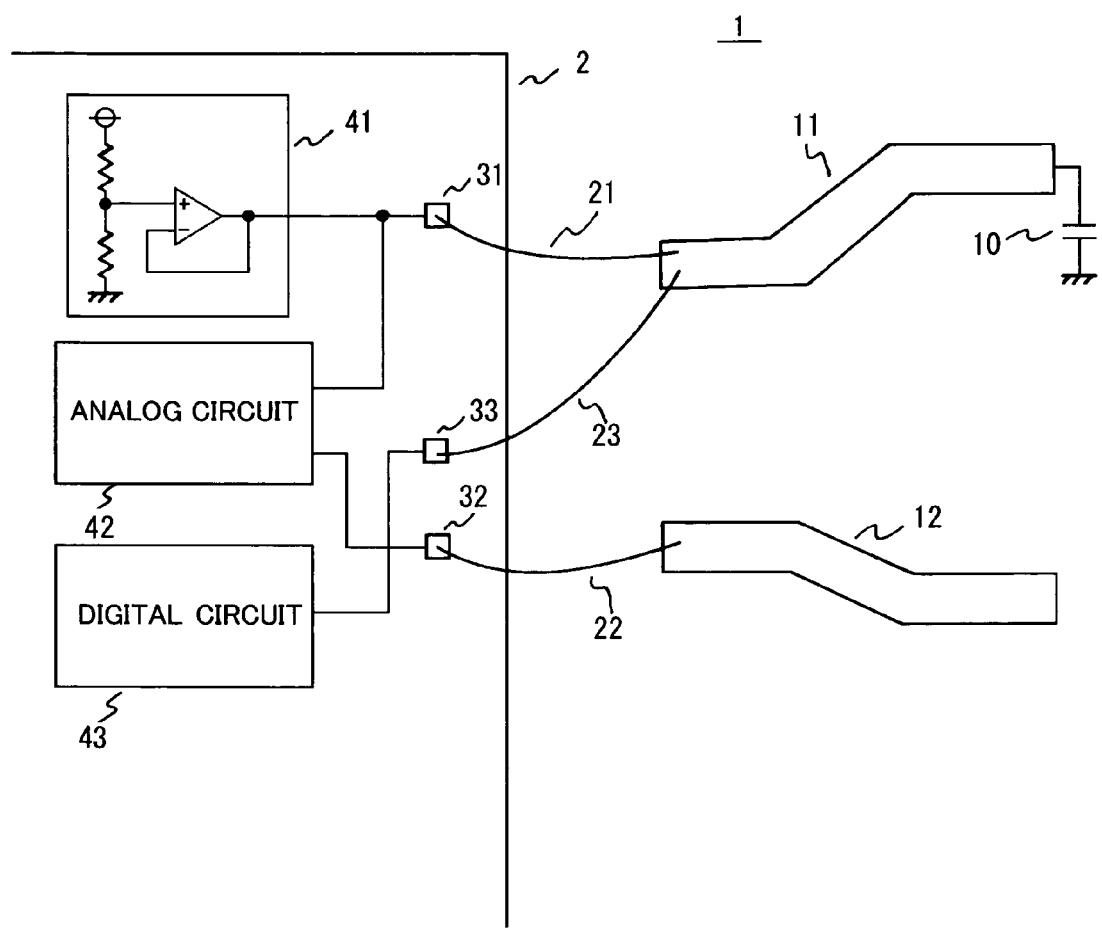
FIG. 1 is a schematic plan view which shows a portion of a semiconductor integrated device constituting a first embodiment of the present invention.

Embodiments of the present invention will be described in detail below with reference to the attached figures. FIG. 1 is a diagram which shows the construction of a semiconductor integrated device constituting a first embodiment of the present invention. This semiconductor integrated device 1 contains a semiconductor chip 2, leads 11 and 12 whose end portions on the opposite ends from the ends facing the semiconductor chip 2 constitute external terminals, and bonding wires 21, 22 and 23 which connect the semiconductor chip 2 and the end portions of these leads 11 and 12 facing the semiconductor chip 2. The semiconductor chip 2 contains a reference voltage generating circuit 41, an analog circuit 42 which is vulnerable to noise, a digital circuit 43 that generates high-frequency noise, and bonding pads 31, 32 and 33. The reference voltage generating circuit 41 is electrically connected to the analog circuit 42 and bonding pad 31, the analog circuit 42 is electrically connected to the bonding pad 32, and the digital circuit 43 is electrically connected to the bonding pad 33, respectively by metal wiring formed on the surface of the semiconductor chip 2. The bonding pad 31 is electrically connected to the end portion of the lead 11 facing the semiconductor chip 2 by the bonding wire 21, and the bonding pad 32 is electrically connected to the end portion of the lead 12 facing the semiconductor chip 2 by the bonding wire 22. Furthermore, the end portion of the lead 11 facing the semiconductor chip 2 is further connected with the bonding wire 23 in the vicinity of the connection point with the bonding wire 21. The other end of the bonding wire 23 is connected to the bonding pad 33. An externally attached capacitor 10 which is used to absorb high-frequency noise is connected to the lead 11 which acts as an external terminal of the semiconductor integrated device 1.

Accordingly, the output of the reference voltage generating circuit 41 is supplied to the analog circuit 42, and is also supplied to the lead 11 via the bonding pad 31 and bonding wire 21. Furthermore, this output is supplied to the externally attached capacitor 10 from the lead 11, and is supplied to the digital circuit 43 via the bonding wire 23 and bonding pad 33. The input-output of the analog circuit 42 is performed by the lead 12 via the bonding pad 32 and bonding wire 22.

As a result, in cases where high-frequency noise is generated in the digital circuit 43, this noise is transmitted to the lead 11 via the bonding pad 33 and bonding wire 23. Furthermore, this noise is absorbed by the externally attached capacitor 10 before being transmitted to the reference voltage generating circuit 41 and analog circuit 42 via the bonding wire 21 and bonding pad 31. The reason for this is as follows: namely, as was described above, the impedance of a bonding wire is 10 mΩ or greater, and is ordinarily a large value of approximately 100 mΩ, although this also depends on the length; however, the impedance of the lead is ordinarily 2 mΩ or less. Accordingly, while the transmission of high-frequency noise is suppressed by the bonding wire 21, the transmission of such noise from the lead to the externally attached capacitor 10 is not suppressed to as great an extent.

Thus, the high-frequency noise is not transmitted to the power supply of the reference voltage generating circuit 41, and is not transmitted to the analog circuit 42. Accordingly, the power supply voltage of the reference voltage generating circuit 41 can be stabilized, and erroneous operation or a drop in precision of the analog circuit 42 can be prevented.

Similar application is also possible in cases where the digital circuit 43 is replaced by an analog circuit which is different from the analog circuit 42 and which generates high-frequency noise, so that a semiconductor integrated device similar to that described above can be obtained.

Figure 2:
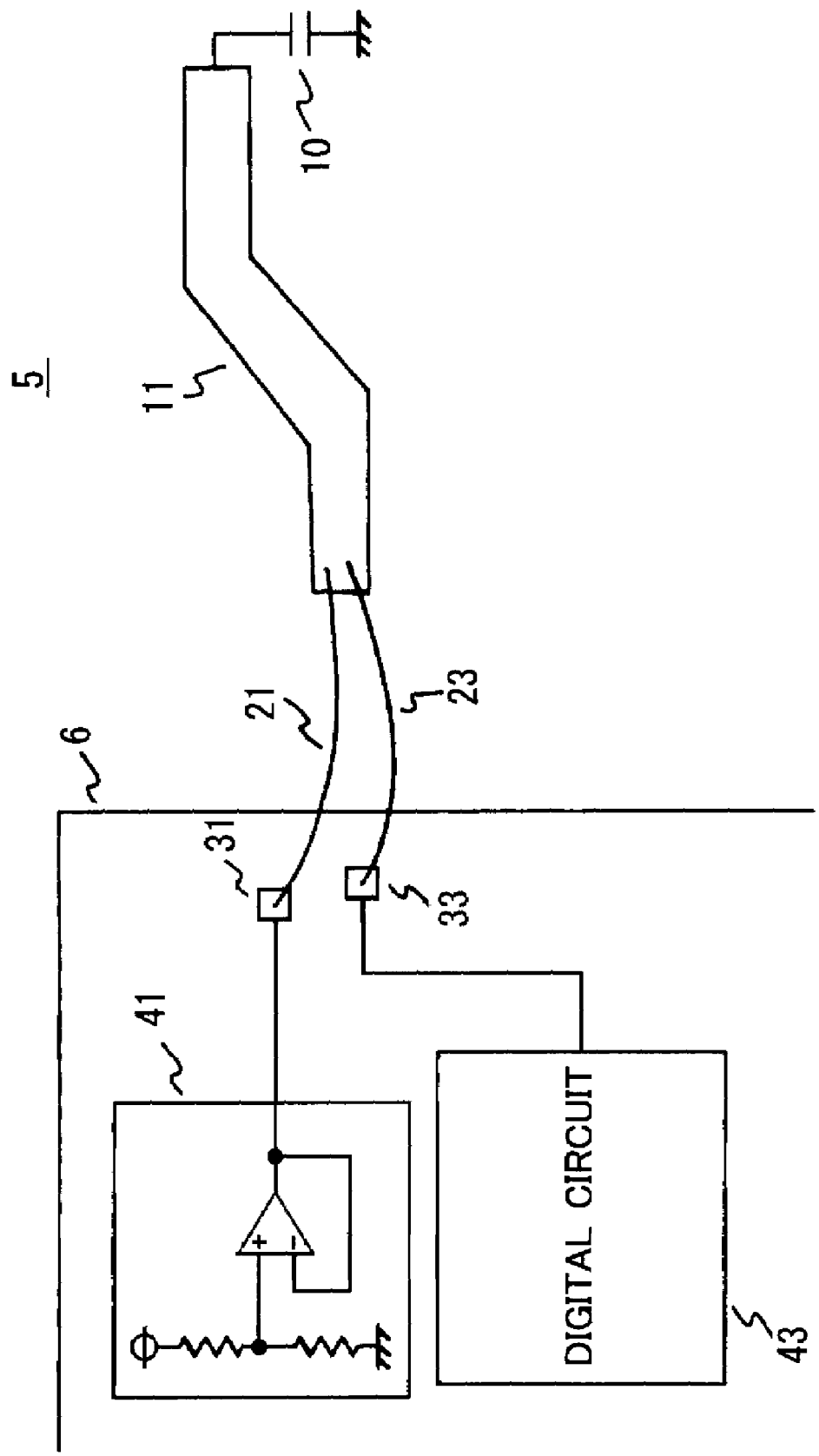
FIG. 2 is a schematic plan view which shows a portion of a semiconductor integrated device constituting a second embodiment of the present invention.
Figure 3:
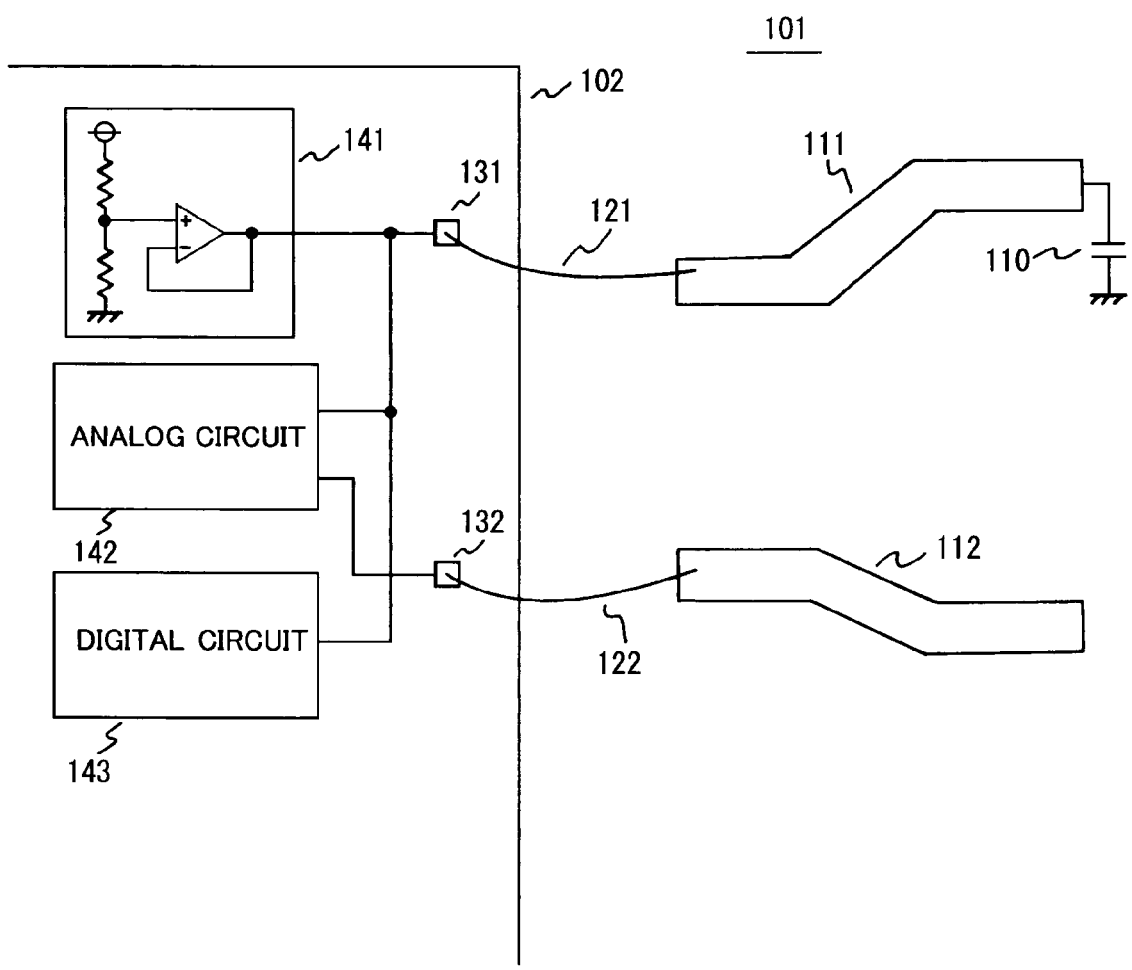
FIG. 3 is a schematic plan view which shows a portion of a conventional semiconductor integrated device.

FIG. 2 is a diagram which shows the construction of a semiconductor integrated device constituting a second embodiment of the present invention. This semiconductor integrated device 5 doesn't contain the analog circuit 42 and associated parts in the semiconductor chip 6; otherwise, this semiconductor integrated device 5 contains substantially the same constituent elements as those of the semiconductor integrated device 1 of the first embodiment described above.

This semiconductor integrated device 5 is a construction which is particularly used in cases where stabilization of he power supply voltage of the reference voltage generating circuit 41 is to be achieved. Similar application is possible even if the digital circuit 43 is replaced by an analog circuit.

The present invention is not limited to the embodiments described above; various design alterations are possible within the scope of matters described in the claims. For example, it goes without saying that the present invention can also be applied in cases where the semiconductor chip comprises a plurality of analog circuits and digital circuits.

What is claimed is:

1. A semiconductor integrated device comprising:
  a reference voltage generating circuit formed on a surface of a semiconductor chip;
  a first bonding pad which is connected to the output of the reference voltage generating circuit;
  a lead which is connected to the first bonding pad via a first bonding wire and which is connected to a capacitor;
  a second bonding pad which is connected to said lead, in the vicinity of the connection point with said first bonding wire, via a second bonding wire; and
  a circuit, formed on the surface of the semiconductor chip, which generates high-frequency noise and is connected to the second bonding pad.

2. The semiconductor integrated device according to claim 1, further comprising an analog circuit connected to the output of the reference voltage generating circuit by wiring formed on the surface of the semiconductor chip.

3. The semiconductor integrated device according to claim 1, wherein said circuit which generates high-frequency noise is a digital circuit.

4. The semiconductor integrated device according to claim 1, wherein said circuit which generates high-frequency noise is an analog circuit.

* * * * *